United States Patent
Pai et al.

(10) Patent No.: US 8,253,038 B2
(45) Date of Patent: Aug. 28, 2012

(54) ENCLOSURE OF ELECTRONIC DEVICE

(75) Inventors: Yu-Chang Pai, Taipei Hsien (TW); Chien-Hung Liu, Taipei Hsien (TW); Po-Chuan Hsieh, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 221 days.

(21) Appl. No.: 12/849,939

(22) Filed: Aug. 4, 2010

(65) Prior Publication Data

US 2011/0266047 A1 Nov. 3, 2011

(30) Foreign Application Priority Data

Apr. 30, 2010 (TW) .............................. 99113770 A

(51) Int. Cl.
*H05K 9/00* (2006.01)
*H02B 1/56* (2006.01)

(52) U.S. Cl. ....................................... 174/383; 454/184

(58) Field of Classification Search .................. 174/383; 454/184; 361/679.46, 816
See application file for complete search history.

(56) References Cited

U.S. PATENT DOCUMENTS

| 5,297,004 | A | * | 3/1994 | Mazura | 361/690 |
| 5,697,840 | A | * | 12/1997 | Bainbridge et al. | 454/184 |
| 7,674,165 | B2 | * | 3/2010 | Lu et al. | 454/184 |
| 7,796,376 | B2 | * | 9/2010 | Cairo et al. | 361/678 |
| 2006/0148399 | A1 | * | 7/2006 | Su | 454/184 |
| 2008/0006444 | A1 | * | 1/2008 | Cochrane | 174/383 |

* cited by examiner

*Primary Examiner* — Hung Ngo
(74) *Attorney, Agent, or Firm* — Altis Law Group, Inc.

(57) ABSTRACT

An enclosure includes a plate. The plate defines a number of through holes. A first shield extends from an edge bounding each through hole. A second shield extends from the edge bounding each through hole, opposite to the first shields. Each through hole is partially covered by a corresponding first shield and a corresponding second shield. The enclosure with the shields can shield the electronic device from electromagnetic interference.

13 Claims, 3 Drawing Sheets

ENCLOSURE OF ELECTRONIC DEVICE

CROSS-REFERENCE TO RELATED APPLICATIONS

Relevant subject matter is disclosed in the co-pending U.S. patent applications Ser. Nos. 12/841,125, 12/855,903, 12/859,283, 12/860,941 12/868,687 and 12/869,709 having the same title, which are assigned to the same assignee as named herein.

BACKGROUND

1. Technical Field

The present disclosure relates to an enclosure of an electronic device.

2. Description of Related Art

For the enclosure of a typical electronic device, electromagnetic interference (EMI) is a common problem during operation. Commonly, through holes are defined in the enclosure for aiding in heat dissipation, and though sizes and placement of the holes are chosen and arranged to help avoid EMI, problems from EMI still occur.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
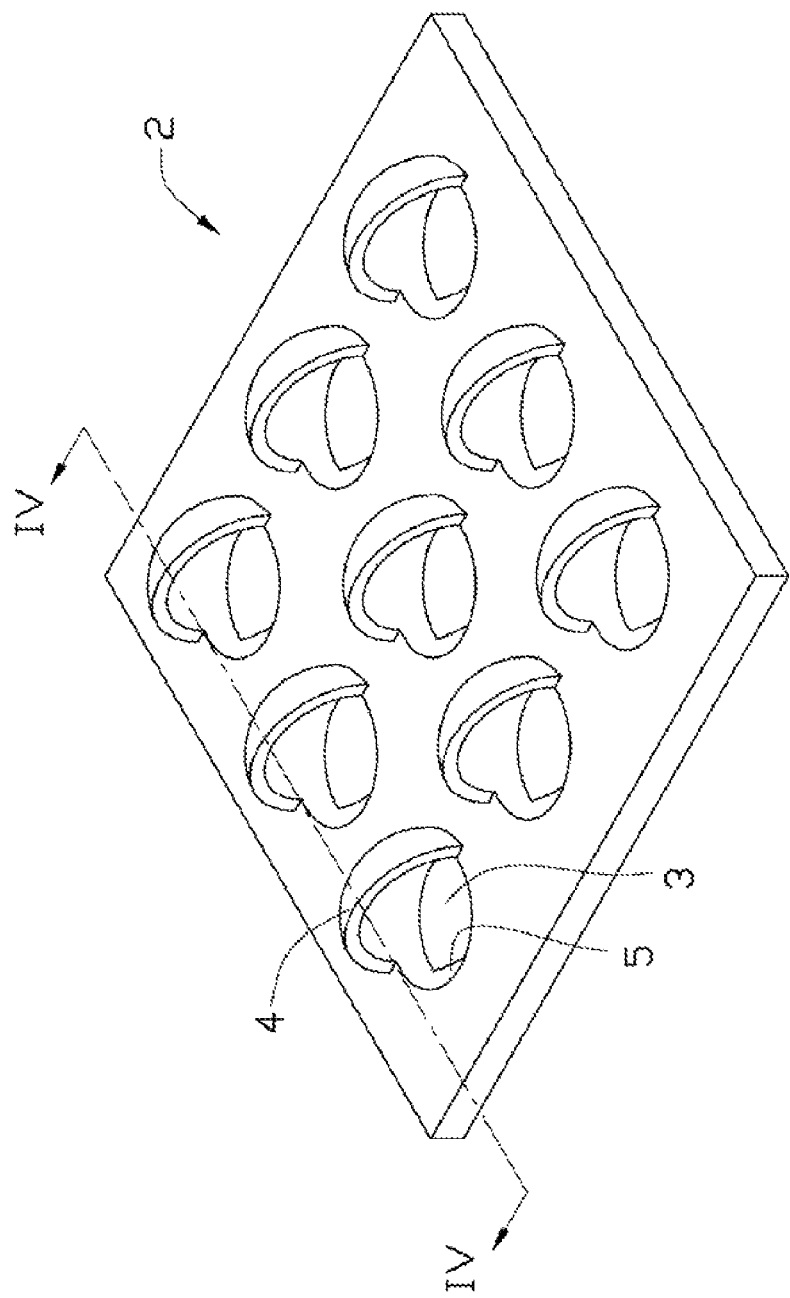
FIG. 1 is an isometric view of a plate in an exemplary embodiment of an enclosure.
Figure 2:
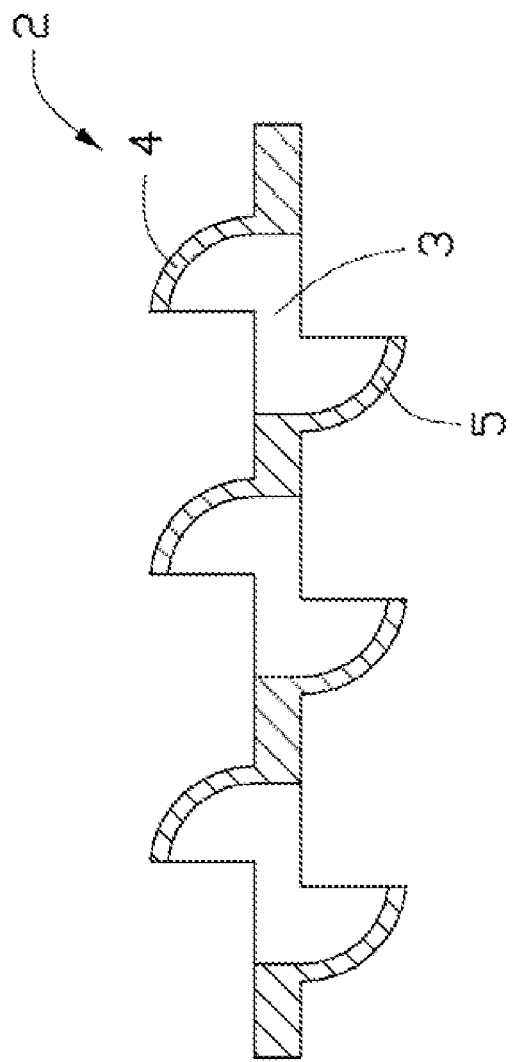
FIG. 2 is a sectional view taken along the line VI-VI of FIG. 1.

Referring to FIGS. 1 and 2, an exemplary embodiment of an enclosure includes a plate 2. The plate 2 can be arranged on a front side or a back side of the enclosure.

The plate 2 defines a plurality of through holes 3. A first shield 4 extends from an edge partially bounding each through hole 3 towards a first direction. A second shield 5 extends from the edge partially bounding each through hole 3 towards a second direction opposite to the first direction. Each first shield 4 and second shield 5 are partially dome-shaped. In the present embodiment, each of the first shields 4 and the second shields 5 is substantially shaped as a quarter of a spherical surface. Each through hole 3 is round in shape, and includes a first portion, a second portion, and a third portion between the first and second portions. The first portion is covered by the first shield 4. The second portion is covered by the second shield 5. The third portion is not covered by the first shield 4 and the second shield 5. In other words, the first shield 4 and the second shield 5 cannot fully cover the through hole 3. As a result, heat inside the enclosure can be vented to the outside through the through holes 3.

Figure 3:
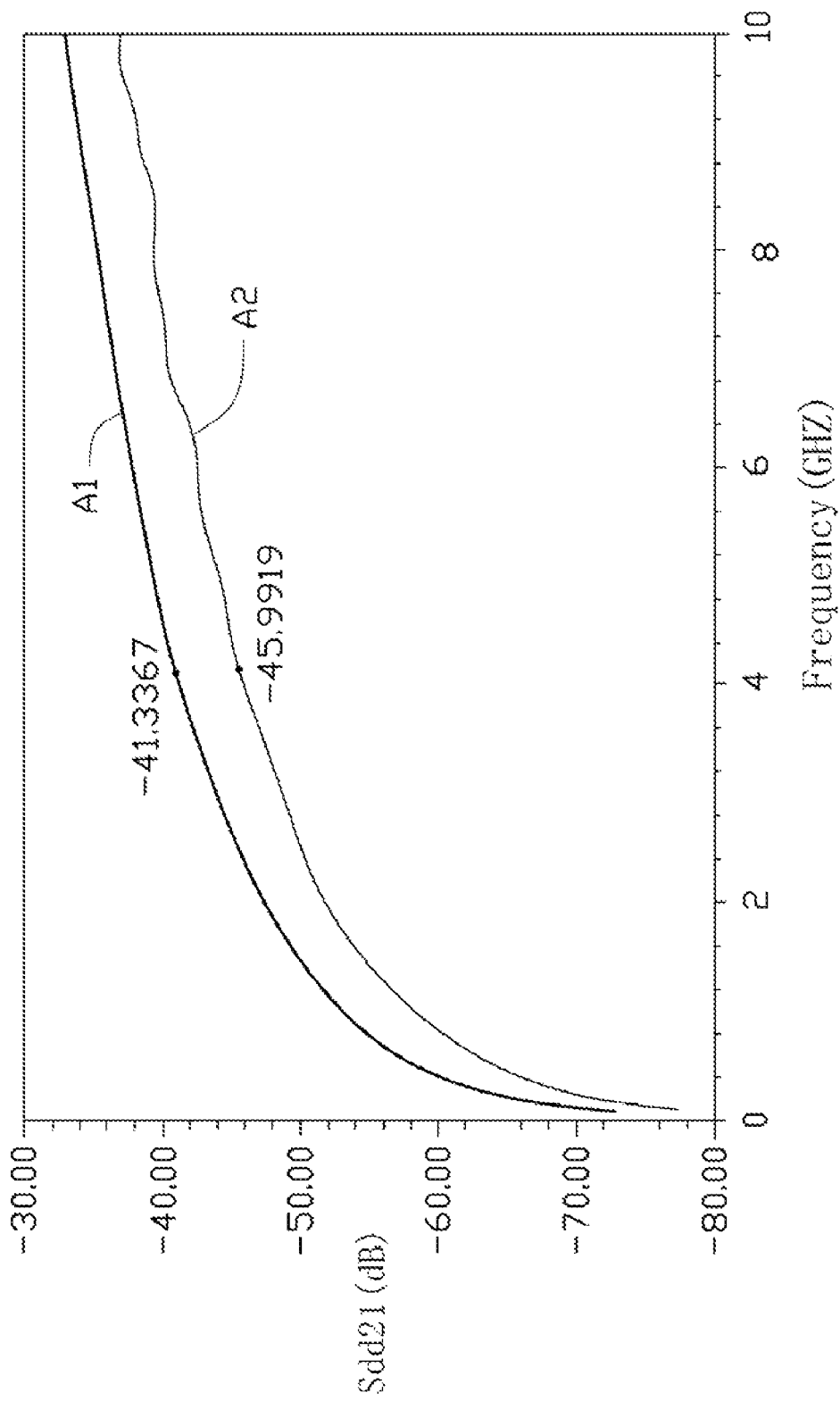
FIG. 3 is a graph showing EMI shielding effectiveness of a conventional enclosure and the enclosure using the plate of FIG. 1.

Referring to FIG. 3, a curve A1 represents electromagnetic interference (EMI) shielding effectiveness of a conventional enclosure. A curve A2 represents EMI shielding effectiveness of the enclosure with the plate 2 of FIG. 1. FIG. 3 clearly indicates that the EMI shielding effectiveness of the enclosure with the plate 2 is better than the EMI shielding effectiveness of the conventional enclosure.

In other embodiments, the size of the shields 4 and 5 can be changed according to need. When the shields 4 and 5 are configured with a different size, the EMI shielding effectiveness of the enclosure may be different. In addition, shape of the through holes 3 need not be round as shown in the figures.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An enclosure of an electronic device, the enclosure comprising a plate, wherein the plate defines a plurality of through holes, a first shield extends in a first direction from an edge partially bounding each through hole, a second shield extends in a second direction opposite to the first direction from an edge partially bounding each through hole, each through hole is partially covered by a corresponding first shield and a corresponding second shield.

2. The enclosure of claim 1, wherein each through hole is round.

3. The enclosure of claim 1, wherein each shield is partially dome-shaped.

4. The enclosure of claim 1, wherein each shield is substantially shaped as a quarter of spherical surface.

5. An enclosure of an electronic device, the enclosure comprising a plate, wherein the plate defines a plurality of through holes, a first shield extends in a first direction from an edge bounding each through hole, a second shield extends in a second direction opposite to the first direction from the edge bounding each through hole, each through hole comprises a first portion covered by the first shield and a second portion covered by the second shield.

6. The enclosure of claim 5, wherein each through hole further comprises a third portion not covered by the corresponding first and second shields.

7. The enclosure of claim 5, wherein each through hole is round.

8. The enclosure of claim 5, wherein each shield is partially dome-shaped.

9. The enclosure of claim 5, wherein each shield is substantially shaped as a quarter of spherical surface.

10. An enclosure of an electronic device, the enclosure comprising a plate, wherein the plate defines a plurality of through holes, a plurality of first and second shields extends from the corresponding through holes, each first shield extends from the plate, each second shield extends opposite to the first shields from the plate, each first shield and a corresponding second shield surround and partly cover a corresponding through hole.

11. The enclosure of claim 10, wherein each through hole is round.

12. The enclosure of claim 10, wherein each shield is partially dome-shaped.

13. The enclosure of claim 10, wherein each shield is substantially shaped as a quarter of spherical surface.

* * * * *